US012690137B2

(12) United States Patent
Ji et al.

(10) Patent No.: US 12,690,137 B2
(45) Date of Patent: Jul. 21, 2026

(54) PRINTED CIRCUIT BOARD

(71) Applicant: SAMSUNG ELECTRO-MECHANICS CO., LTD., Suwon-si (KR)

(72) Inventors: Yun Je Ji, Suwon-si (KR); Yong Hoon Kim, Suwon-si (KR); Seung Eun Lee, Suwon-si (KR); Joo Hwan Jung, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 539 days.

(21) Appl. No.: 18/202,808

(22) Filed: May 26, 2023

(65) Prior Publication Data
US 2024/0172368 A1 May 23, 2024

(30) Foreign Application Priority Data

Nov. 23, 2022 (KR) ........................ 10-2022-0158147

(51) Int. Cl.
| | |
|---|---|
| *H05K 1/185* | (2026.01) |
| *H05K 1/11* | (2006.01) |
| *H05K 3/46* | (2006.01) |
| *H10W 90/00* | (2026.01) |
| *H10W 90/20* | (2026.01) |

(52) U.S. Cl.
CPC ............. H05K 1/185 (2013.01); H05K 1/112 (2013.01); H05K 3/4697 (2013.01); H10W 90/00 (2026.01); H05K 2201/096 (2013.01); H10W 90/20 (2026.01); H10W 90/724 (2026.01)

(58) Field of Classification Search
CPC ........ H05K 1/185; H05K 1/112; H01L 24/16; H01L 25/0657
USPC ......................................................... 174/262
See application file for complete search history.

(56) References Cited

U.S. PATENT DOCUMENTS

| | | | |
|---|---|---|---|
| 2009/0152693 A1* | 6/2009 | Sato ..................... | H01L 25/0657 257/784 |
| 2016/0219711 A1* | 7/2016 | Lee ....................... | H05K 1/0271 |
| 2016/0233167 A1 | 8/2016 | Shimizu | |
| 2017/0141744 A1* | 5/2017 | Kim .................. | H01L 23/49827 |
| 2018/0134546 A1* | 5/2018 | Oh .......................... | H01L 23/315 |
| 2021/0296221 A1* | 9/2021 | Yang ................... | H01L 23/5385 |
| 2021/0375845 A1 | 12/2021 | Stone et al. | |

FOREIGN PATENT DOCUMENTS

JP 2016-149411 A 8/2016

* cited by examiner

*Primary Examiner* — Andargie M Aychillhum
(74) *Attorney, Agent, or Firm* — MORGAN, LEWIS & BOCKIUS LLP

(57) ABSTRACT

A printed circuit board includes: a first board unit including a plurality of first insulating layers and a plurality of first wiring layers respectively disposed on or in the plurality of first insulating layers; a second board unit including one or more second insulating layers and one or more second wiring layers respectively disposed on or in the one or more second insulating layers; and a first passive device embedded in at least one of the first and second board units. The second board unit is disposed on the first board unit, and the first board unit has a second cavity passing through at least a portion of the plurality of first insulating layers on the first passive device based on a stacking direction of the plurality of first wiring layers.

26 Claims, 16 Drawing Sheets

500A

PRINTED CIRCUIT BOARD

CROSS-REFERENCE TO RELATED APPLICATION(S)

This application claims benefit of priority to Korean Patent Application No. 10-2022-0158147 filed on Nov. 23, 2022 in the Korean Intellectual Property Office, the disclosure of which is incorporated herein by reference in its entirety.

TECHNICAL FIELD

The present disclosure relates to a printed circuit board, for example, a printed circuit board in which a passive device such as an integrated passive device (IPD) is embedded.

BACKGROUND

In a printed circuit board for a semiconductor package, for example, a land side capacitor (LSC) or the like has been mounted on a surface of the board to secure a power integrity (PI) characteristic, and recently, an embedded passive board (EPS) structure has been actively employed.

However, when the LSC is mounted on the surface of the board, the number of solder balls may be limited, and the thicker the board, the greater a distance between a semiconductor chip mounted on the board and the LSC. In addition, in the case of the EPS structure, there may be difficulties in matching a thickness of the passive device and a thickness of a copper clad laminate (CCL), and there may be difficulties in connecting the passive devices to each other in parallel.

SUMMARY

An aspect of the present disclosure may provide a printed circuit board which may minimize a distance between a semiconductor chip mounted on the board and a passive device.

Another aspect of the present disclosure may provide a printed circuit board in which a plurality of passive devices may be easily connected to each other in parallel.

The present disclosure may provide a printed circuit board in which a first passive device is embedded in the board, and a second cavity passes through at least a portion of a plurality of insulating layers included in the board, which are disposed on the second passive device, and the second passive device is thus embedded in the second cavity when a semiconductor chip to which the second passive device is attached is mounted on the board.

According to an aspect of the present disclosure, a printed circuit board may include: a first board unit including a plurality of first insulating layers and a plurality of first wiring layers respectively disposed on or in the plurality of first insulating layers; a second board unit including one or more second insulating layers and one or more second wiring layers respectively disposed on or in the one or more second insulating layers; and a first passive device embedded in at least one of the first and second board units. The second board unit may be disposed on the first board unit, and the first board unit may have a second cavity passing through at least a portion of the plurality of first insulating layers on the first passive device based on a stacking direction of the plurality of first wiring layers.

The present disclosure may provide a printed circuit board in which first and second cavities respectively pass through at least different portions of a plurality of insulating layers included in the board based on a stacking direction and are tapered in opposite directions, and a first passive device is then disposed and embedded in the first cavity for a second passive device to be embedded in the second cavity when a semiconductor chip to which the second passive device is attached is mounted on the board.

According to another aspect of the present disclosure, a printed circuit board may include: a board unit including a plurality of insulating layers and a plurality of wiring layers, and having a first cavity passing through at least a portion of the plurality of insulating layers based on a stacking direction of the plurality of wiring layers and a second cavity passing through at least another portion of the plurality of insulating layers based on the stacking direction; and a first passive device disposed in the first cavity and having at least a portion embedded in the plurality of insulating layers. Inner wall surfaces of the first and second cavities may be tapered in opposite directions.

According to another aspect of the present disclosure, a printed circuit board may include: a plurality of insulating layers and a plurality of wiring layers stacked in a stacking direction; a first device at least partially embedded in the plurality of insulating layers; and a cavity extending from an outermost one of the plurality of insulating layers to overlap at least a portion of the first device in the stacking direction. The first device may be spaced apart from a region of the second cavity between side surfaces of the outermost one of the plurality of insulating layers.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
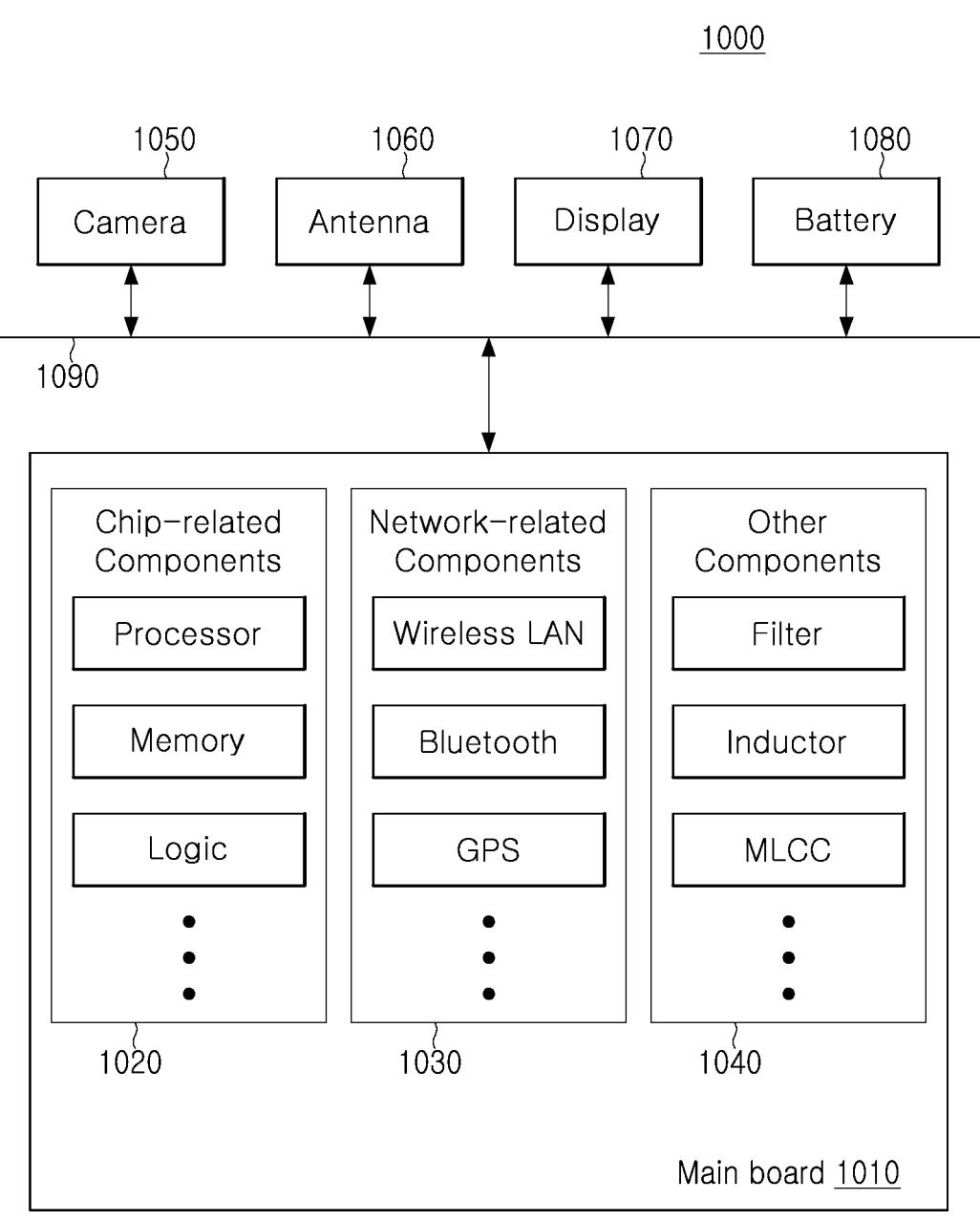
FIG. 1 is a block diagram schematically showing an example of an electronic device system.

FIG. 1 is a block diagram schematically showing an example of an electronic device system.

Referring to FIG. 1, an electronic device 1000 may accommodate a main board 1010. The main board 1010 may include chip-related components 1020, network-related components 1030, other components 1040 and the like, which are physically or electrically connected thereto. These components may be connected to other electronic components described below to form various signal lines 1090.

The chip-related components 1020 may include a memory chip such as a volatile memory (for example, a dynamic random access memory (DRAM)), a non-volatile memory (for example, a read only memory (ROM)), or a flash memory; an application processor chip such as a central processor (for example, a central processing unit (CPU)), a graphics processor (for example, a graphics processing unit (GPU)), a digital signal processor, a cryptographic processor, a microprocessor, or a microcontroller; and a logic chip such as an analog-to-digital (ADC) converter or an application-specific integrated circuit (ASIC). However, the chip-related components 1020 are not limited thereto, and may also include other types of chip-related components. In addition, the chip-related components 1020 may be combined with each other. The chip-related component 1020 may be a package including the above-mentioned chip or electronic component.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network-related components 1030 are not limited thereto, and may also include any of various other wireless or wired standards or protocols. In addition, the network-related components 1030 may be combined with the chip-related components 1020.

The other components 1040 may include a high frequency inductor, a ferrite inductor, a power inductor, ferrite beads, low temperature co-firing ceramics (LTCC), an electromagnetic interference (EMI) filter, a multilayer ceramic condenser (MLCC) and the like. However, the other components 1040 are not limited thereto, and may further include a passive device in the form of a chip component used for various other purposes in addition to these components. In addition, the other components 1040 may be combined with the chip-related components 1020 or the network-related components 1030.

The electronic device 1000 may include another electronic component that may be or may not be physically or electrically connected to the main board 1010, based on a type of the electronic device 1000. Another electronic component may be a camera module 1050, an antenna module 1060, a display 1070, a battery 1080, etc. However, another electronic component is not limited thereto, and may be an audio codec, a video codec, a power amplifier, a compass, an accelerometer, a gyroscope, a speaker, a mass storage device (e.g., a hard disk drive), a compact disk (CD), a digital versatile disk (DVD), etc. In addition, another electronic component may be another electronic component used for various purposes, based on the type of the electronic device 1000.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive or the like. However, the electronic device 1000 is not limited thereto, and may also be any other electronic device processing data.

Figure 2:
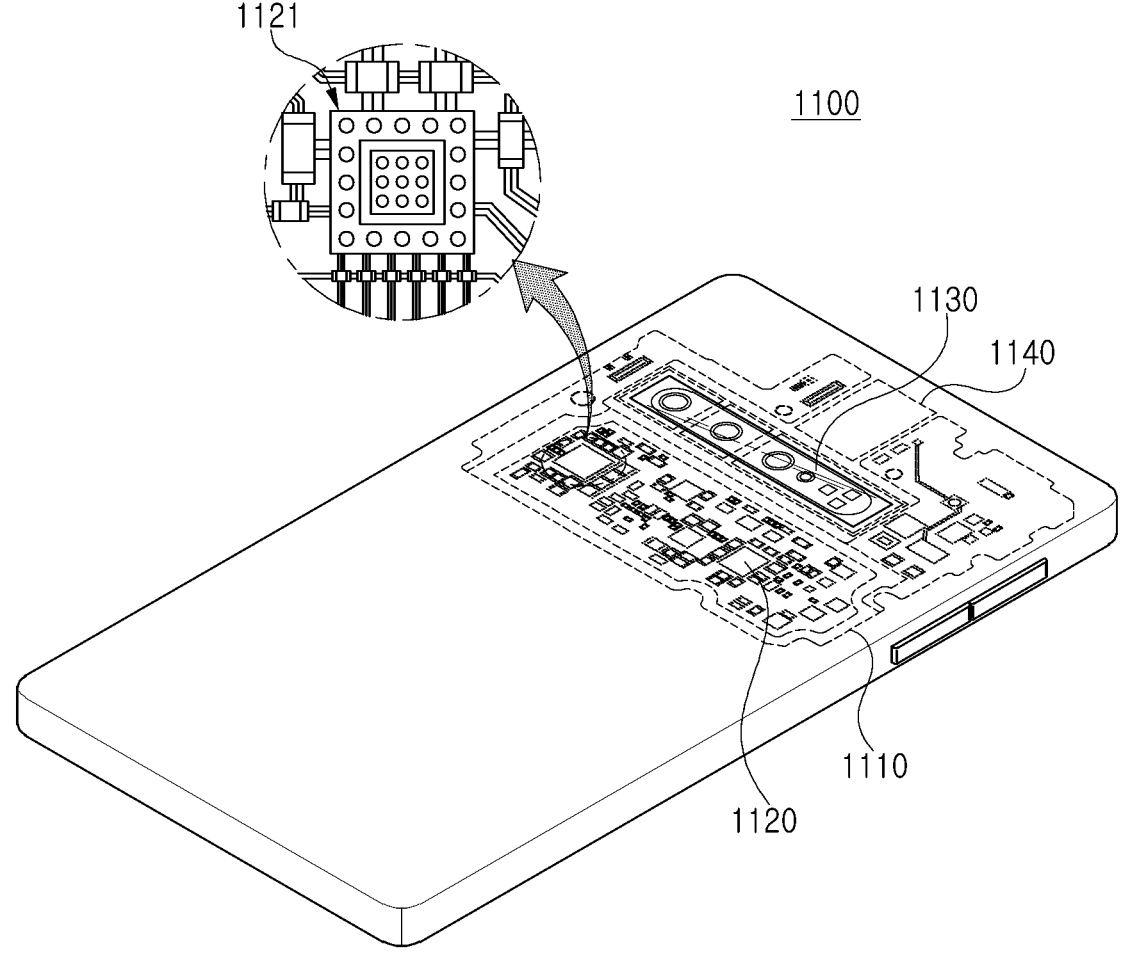
FIG. 2 is a perspective view schematically showing an example of an electronic device.

FIG. 2 is a perspective view schematically showing an example of an electronic device.

Referring to FIG. 2, the electronic device may be, for example, a smartphone 1100. The smartphone 1100 may accommodate a motherboard 1110, and various components 1120 may be physically or electrically connected to the motherboard 1110. In addition, the motherboard 1110 may accommodate other components that may or may not be physically or electrically connected thereto, such as the camera module 1130 or a speaker 1140. Some of the components 1120 may be the chip-related components, for example, a component package 1121, and are not limited thereto. The component package 1121 may be a printed circuit board on which electronic components including active components or passive components are surface-mounted. Alternatively, the component package 1121 may be a printed circuit board in which the active components or the passive components are embedded. Meanwhile, the electronic device is not necessarily limited to the smartphone 1100, and may be another electronic device as described above.

Printed Circuit Board

Figure 3:
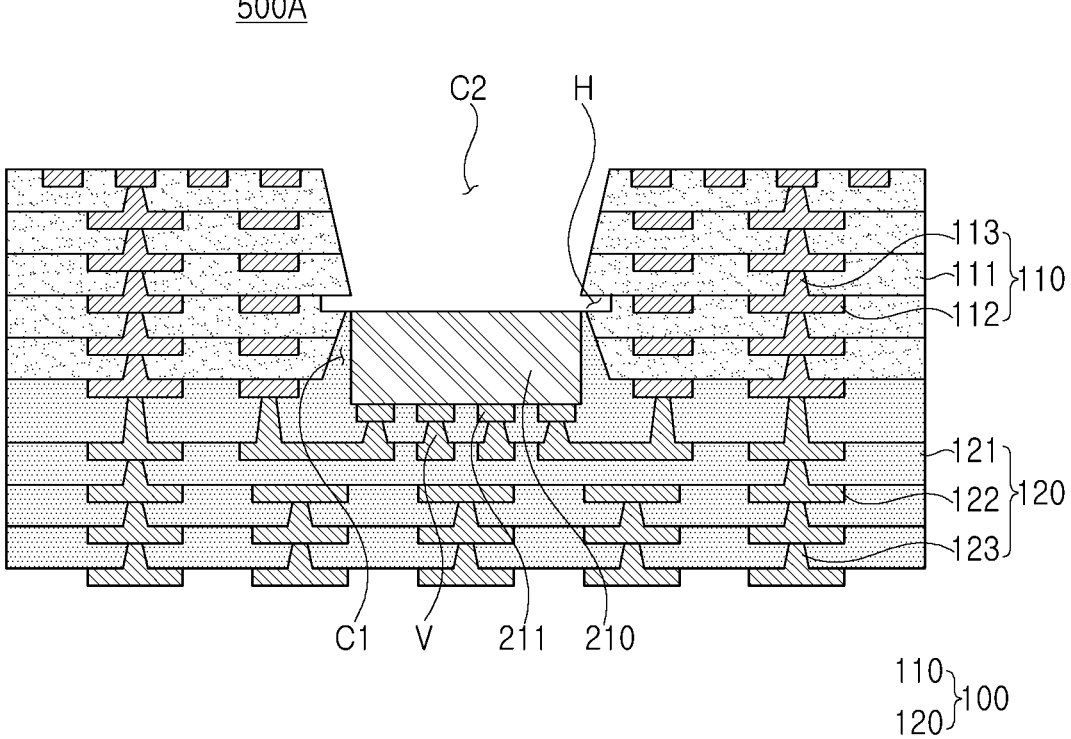
FIG. 3 is a cross-sectional view schematically showing a printed circuit board according to an exemplary embodiment.

FIG. 3 is a cross-sectional view schematically showing a printed circuit board according to an exemplary embodiment.

Figure 4:
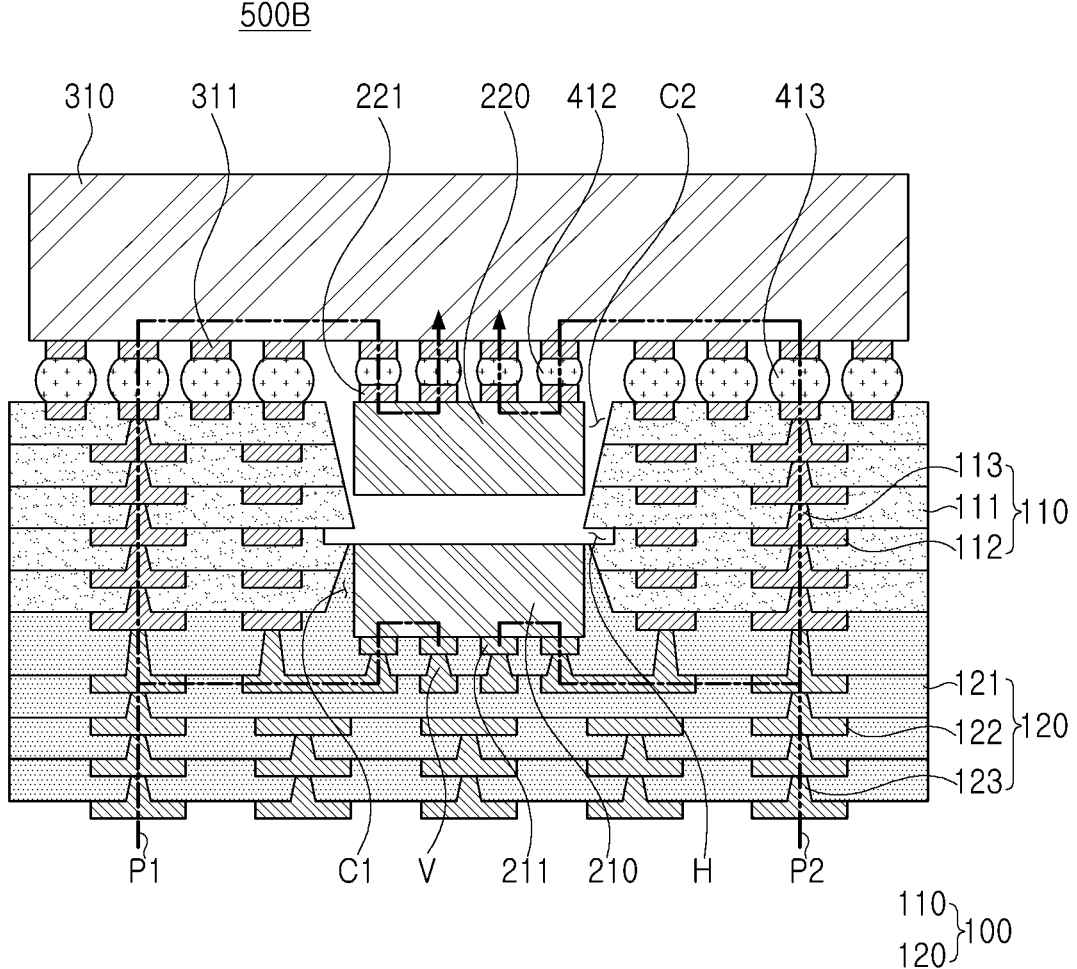
FIG. 4 is a cross-sectional view schematically showing a modified example of the printed circuit board of FIG. 3.

FIG. 4 is a cross-sectional view schematically showing a modified example of the printed circuit board of FIG. 3.

Referring to FIG. 3, a printed circuit board 500A according to an exemplary embodiment may include a board unit 100 having first and second cavities C1 and C2 formed at different levels based on a stacking direction, and a first passive device 210 disposed in the first cavity C1 and embedded in the board unit 100. In addition, a printed circuit board 500B in the modified example may further include a semiconductor chip 310 disposed on the board unit 100 and a second passive device 220 disposed in the second cavity C2 formed between the board unit 100 and the semiconductor chip 310.

Meanwhile, in the printed circuit board for the semiconductor package, for example, a land side capacitor (LSC) or the like may be mounted on a surface of the board to secure a power integrity (PI) characteristic, and recently, an embedded passive substrate (EPS) structure may be actively employed. However, when the LSC is mounted on the surface of the board, the number of solder balls may be limited, and the thicker the board, the greater a distance between the semiconductor chip that is mounted on the board and the LSC. In addition, in the case of the EPS structure, there may be difficulties in matching a thickness of the passive device and a thickness of a copper clad laminate (CCL), and there may be difficulties in connecting the passive devices to each other in parallel.

On the other hand, in the printed circuit board 500A according to an exemplary embodiment and the printed circuit board 500B in the modified example, for example, the first cavity C1 may be formed during a build-up process of a coreless board unit 100, without a separate core layer, and the first passive device 210 may then be embedded, and the second cavity C2 may be additionally formed on the first cavity C1 based on the stacking direction. Here, as shown in the printed circuit board 500B in the modified example, the semiconductor chip 310 may be mounted on the board unit 100, and in this case, the second passive device 220 may be attached to an active surface of the semiconductor chip 310 and disposed in the second cavity C2. It is thus possible to minimize a distance between the semiconductor chip 310 and the first passive device 210 or the second passive device 220. In addition, the first and second passive devices 210 and 220 may be easily connected to each other in parallel. It is thus possible to further improve the power integrity (PI) characteristic.

Meanwhile, the first and second cavities C1 and C2 may be disposed for the respective cavities to at least partially overlap each other based on the stacking direction. In this case, a barrier layer for forming the first and second cavities C1 and C2 may be shared during the process. In addition, it is possible to further minimize a distance between the first and second passive devices 210 and 220 disposed in the first and second cavities C1 and C2. In addition, this configuration may be more advantageous in terms of warpage control of the board unit 100.

Meanwhile, each of the first and second cavities C1 and C2 may have tapered inner wall surfaces, and here, the inner wall surfaces of each of the first and second cavities C1 and C2 may be tapered in opposite directions. For example, as in the process to be described below, the first cavity C1 may be formed during the build-up process, and the second cavity C2 may be formed after the build-up process is completed. Therefore, the first and second cavities may have inclined surfaces opposite to each other. In this case, it may be easier to form the first and second cavities C1 and C2, and it may be easier to dispose the first and second passive devices 210 and 220 in the first and second cavities C1 and C2. If necessary, a groove portion H may be formed in a region of the inner wall surface of the second cavity C2 that is adjacent to the bottom surface thereof. The groove portion H may be formed by removing the barrier layer as in the process to be described below. However, the groove portion H is not limited thereto, and may be omitted, depending on the dispositional form or material of the barrier layer.

Meanwhile, the first and second passive devices 210 and 220 may respectively have first and second front surfaces on which the first and second electrode pads 211 and 221 are disposed and first and second rear surfaces opposite to the first and second front surfaces. For example, the first or second passive device 210 or 220 may include an integrated passive device (IPD). It is thus possible to more effectively secure the power integrity (PI) characteristic. In addition, it is possible to dispose the first or second passive device 210 or 220 in a more optimized form in the first or second cavity C1 or C2. The semiconductor chip 310 may include a system on chip (SoC) electrically connected to the integrated passive device (IPD), and is not limited thereto.

Meanwhile, the first passive device 210 may be disposed for the first front surface to face the board unit 110, more specifically, a second board unit 120, and at least a portion of the first rear surface may be exposed from the second cavity C2. For example, insulating layers 111 and 121 included in the board unit 110 may not be disposed between the first and second cavities C1 and C2 based on the stacking direction. In addition, the first and second passive devices 210 and 220 may be disposed so that the first and second rear surfaces face each other. For example, the first electrode pad 211 of the first passive device 210 may be connected to at least one of second wiring layers 122 formed in the second board unit 120 through a via V formed in the second board unit 120. Through this structure, it is possible to further minimize first and second electrical connection paths P1 and P2 formed between the first and second passive devices 210 and 220. Meanwhile, the first and second electrical connection paths P1 and P2 may pass through the wiring layers 112 and 122 in the board units 110 and 120 and the semiconductor chip 310, and the first and second passive devices 210, 220 may be connected to each other in parallel through this configuration. Meanwhile, the first and second electrical connection paths P1 and P2 may respectively be ground and power paths, and are not limited thereto.

Hereinafter, the description describes components of the printed circuit board 500A according to an exemplary embodiment and the printed circuit board 500B in the modified example in more detail with reference to the drawings.

The board unit 100 may include the first board unit 110 having the first and second cavities C1 and C2, and the second board unit 120 disposed on the first board unit 110. Each of the first and second board units 110 and 120 may have the coreless board structure without the core layer.

The first board unit 110 may include the plurality of first insulating layers 111, the plurality of first wiring layers 112 respectively disposed on or in the plurality of first insulating layers 111, and a plurality of first via layers 113 respectively passing through the plurality of first insulating layers 111 to provide the electrical connection path between the plurality of first wiring layers 112; and have the first cavity C1 passing through at least a portion of the plurality of first insulating layers 111 based on the stacking direction, and the second cavity C2 passing through at least another portion of the plurality of first insulating layers 111 based on the stacking direction. The first board unit 110 may be an embedded trace substrate (ETS).

The first insulating layer 111 may include an insulating material, and the insulating material may use an insulating resin such as a thermosetting resin such as an epoxy resin or a thermoplastic resin such as polyimide, a material in which this resin is mixed with an inorganic filler such as silica, a resin impregnated into a core material such as a glass fiber (i.e., glass fiber, glass cloth or glass fabric) together with the inorganic filler, for example, Ajinomoto build-up film (ABF), prepreg, or the like, and is not limited thereto. The plurality of first insulating layers 111 may include the same type of materials, and are not limited thereto.

The first wiring layer 112 may include a metal material, the metal material may use copper (Cu), aluminum (Al), silver (Ag), tin (Sn), gold (Au), nickel (Ni), lead (Pb), titanium (Ti), or an alloy thereof, and is not limited thereto. The first wiring layer 112 may include an electroless plating layer and an electrolytic plating layer, and further include a copper foil if necessary. The first wiring layer 112 may perform various functions based on a design thereof. For example, the first wiring layer 112 may include a ground pattern, a power pattern, a signal pattern, or the like. Here, the signal pattern may include various signals other than the ground pattern, the power pattern, and the like, for example, a data signal. Each of these patterns may include a trace, a plane, or a pad. The uppermost first wiring layer 112 of the plurality of first wiring layers 112 may be embedded so that its upper surface is exposed from the uppermost first insulating layer 111 of the plurality of first insulating layers 111.

The first via layer 113 may include a metal material, the metal material may use copper (Cu), aluminum (Al), silver (Ag), tin (Sn), gold (Au), nickel (Ni), lead (Pb), titanium (Ti), or an alloy thereof, and is not limited thereto. The first via layer 113 may be formed together with the first wiring layer 112, and include the electroless plating layer and the electrolytic plating layer. The first via layer 113 may include a filled via in which a via hole is filled with the metal material, is not limited thereto, and may include a conformal via in which the metal material is disposed along a wall surface of the via hole. The first via layer 113 may be tapered in such a manner that an upper surface width is smaller than a lower surface width in a cross section thereof. The first via layer 113 may perform various functions based on a design thereof. For example, the first via layer 113 may include a ground via, a power via, a signal via, or the like. Here, the signal via may include a via for transferring various signals other than the ground via, the power via, and the like, for example, the data signal. If necessary, at least one of the vias in any one first via layer 113 may pass through the plurality of first insulating layers 111.

The second board unit 120 may include one or more second insulating layers 121, one or more second wiring layers 122 respectively disposed on or in the one or more second insulating layers 121, and one or more second via layers 123 respectively passing through the one or more second insulating layers 121 to provide electrical connection paths between the one or more second wiring layers 122, electrical connection paths between the plurality of first wiring layers 112 and the one or more second wiring layers 122, or electrical connection paths between the first electrode pad 211 and the one or more second wiring layers 122. The second board unit 120 may be a build-up board.

The second insulating layer 121 may include an insulating material, the insulating material may use the insulating resin such as a thermosetting resin such as an epoxy resin or a thermoplastic resin such as polyimide, the material in which this resin is mixed with the inorganic filler such as silica, the resin impregnated into a core material such as a glass fiber (i.e., glass fiber, glass cloth or glass fabric) together with the inorganic filler, for example, Ajinomoto build-up film (ABF), prepreg, or the like, and is not limited thereto. The one or more second insulating layers 121 may include the same type of materials, and are not limited thereto. At least one of the one or more second insulating layers 121 may cover at least a portion of the first passive device 210 and fill at least a portion of the first cavity C1.

The second wiring layer 122 may include a metal material, and the metal material may use copper (Cu), aluminum (Al), silver (Ag), tin (Sn), gold (Au), nickel (Ni), lead (Pb), titanium (Ti), or an alloy thereof, and is not limited thereto. The second wiring layer 122 may include the electroless plating layer and the electrolytic plating layer, and further include the copper foil if necessary. The second wiring layer 122 may perform various functions based on a design thereof. For example, the second wiring layer 112 may include the ground pattern, the power pattern, the signal pattern, or the like. Here, the signal pattern may include various signals other than the ground pattern, the power pattern, and the like, for example, the data signal. Each of these patterns may include the trace, the plane, or the pad.

The second via layer 123 may include the metal material, the metal material may use copper (Cu), aluminum (Al), silver (Ag), tin (Sn), gold (Au), nickel (Ni), lead (Pb), titanium (Ti), or an alloy thereof, and is not limited thereto.

The second via layer 123 may be formed together with the second wiring layer 122, and include the electroless plating layer and the electrolytic plating layer. The second via layer 123 may include the filled via in which a via hole is filled with the metal material, is not limited thereto, and may include the conformal via in which the metal material is disposed along a wall surface of the via hole. The second via layer 123 may be tapered in such a manner that an upper surface width is smaller than a lower surface width in a cross section thereof. The second via layer 123 may perform various functions based on a design thereof. For example, the second via layer 123 may include the ground via, the power via, the signal via, or the like. Here, the signal via may include the via for transferring various signals other than the ground via, the power via, and the like, for example, the data signal. If necessary, at least one of the vias in any one second via layer 123 may pass through the plurality of second insulating layers 121.

The first and second passive devices 210 and 220 may be chip-type components such as inductors and capacitors, may be the integrated passive devices (IPDs), and are not limited thereto. The first and second passive devices 210 and 220 may respectively have the first and second electrode pads 211 and 221. The first and second electrode pads 211 and 221 may include a metal material, and the metal material may use copper (Cu), aluminum (Al), silver (Ag), tin (Sn), gold (Au), nickel (Ni), lead (Pb), titanium (Ti), or an alloy thereof, and is not limited thereto. The first and second electrode pads 211 and 221 may be protruding pads, are not limited thereto, and may be embedded pads which are different from those shown in the drawings.

The semiconductor chip 310 may include a die in the form of an integrated circuit (IC) in which hundreds to millions of elements are integrated into one chip. In this case, the IC may be, for example, a central processor (for example, a CPU), a graphic processor (for example, a GPU), a field programmable gate array (FPGA), a digital signal processor, a cryptographic processor, a micro processor, a micro controller, an application processor (e.g., an AP), an analog-to-digital converter, or a logic chip such as an application-specific IC (ASIC), and is not limited thereto. The semiconductor chip 310 may be the system on chip (SoC), and is not limited thereto.

The semiconductor chip 310 may be formed on the basis of an active wafer. In this case, a base material of a body of the semiconductor chip 130 may be silicon (Si), germanium (Ge), gallium arsenide (GaAs), or the like. Various circuits may be formed on the body. The body 300 may have the active surface on which a connection pad 311 is disposed and a non-active surface opposite to the active surface. The connection pad 311 may include a conductive material such as aluminum (Al) or copper (Cu). The connection pad 311 may be a protruding pad, is not limited thereto, and may be a embedded pad which is different from that shown in the drawings. The semiconductor chip 310 may be a bare die, and a metal bump may be further disposed on the connection pad 311 if necessary. The semiconductor chip 310 may be a packaged die. In this case, a rewiring layer may be additionally formed on the connection pad 311 and the metal bump may be disposed on the rewiring layer.

The semiconductor chip 310 may be disposed on a surface of the first board unit 110 that is opposite to its surface on which the second board unit 120 is disposed for the active surface to face the first board unit 110. The second passive device 220 may be attached to the active surface of the semiconductor chip 310 through a second solder bump 412. For example, some of the connection pads 311 of the semiconductor chip 310 may be connected to the second electrode pads 221 of the second passive device 220 through the second solder bumps 412. The semiconductor chip 310 may be mounted on the first board unit 110 through a third solder bump 413. For example, another some of the connection pads 311 of the semiconductor chip 310 may be connected to the uppermost first wiring layer 112 of the first board unit 110 through the third solder bumps 413. The second or third solder bump 412 or 413 may be formed of a low melting point metal such as tin (Sn)-aluminum (Al)-copper (Cu), may be a ball-type, and is not limited thereto.

FIGS. 5 through 12 are cross-sectional views of a process, schematically showing an example of manufacturing the printed circuit board of FIG. 3 or the printed circuit board of FIG. 4.

Figure 5:
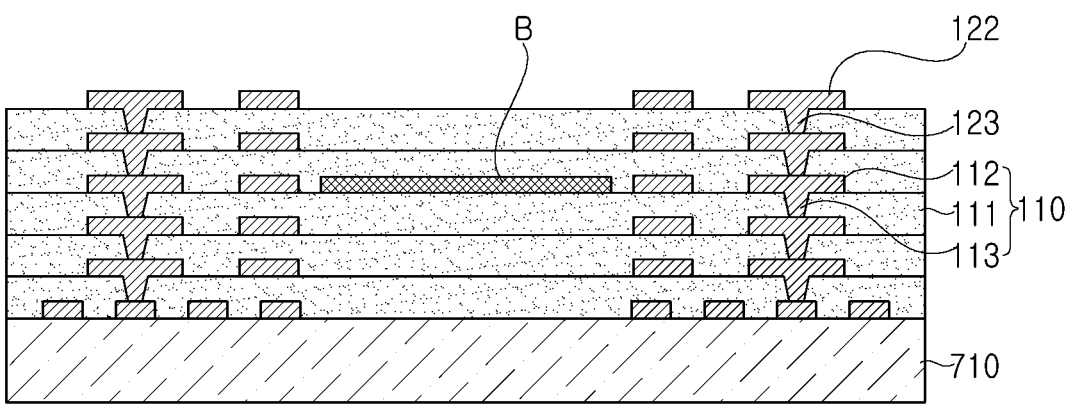
FIGS. 5 through 12 are cross-sectional views of a process, schematically showing an example of manufacturing the printed circuit board of FIG. 3 or the printed circuit board of FIG. 4.

Referring to FIG. 5, the first board unit 110 may be formed using a method of forming the embedded trace board (ETS) on a carrier board 710. Here, a barrier layer B may be formed on or in at least one of the plurality of first insulating layers 111. The barrier layer B may include a metal material, and may be formed together with the first wiring layer 112 of the corresponding layer by using a plating method when forming the first wiring layer 112 in the build-up process. The barrier layer B may include the same metal material as the first wiring layer 112, is not limited thereto, and may include another metal material having a different etching rate. Alternatively, the barrier layer B may include the insulating material, and may be formed using a dry film or the like in the build-up process.

Figure 6:
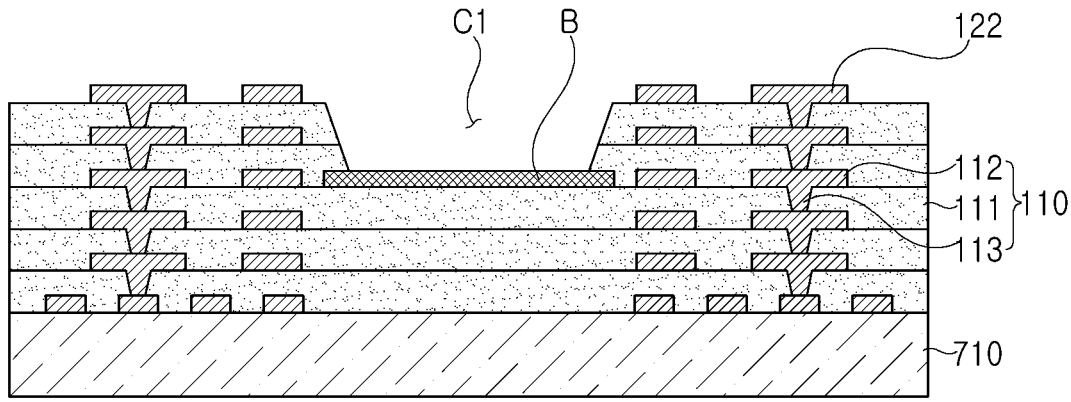

Referring to FIG. 6, the first cavity C1 may be formed in the first board unit 110 by using the barrier layer B as a stopper. The first cavity C1 may pass through at least a portion of the plurality of first insulating layers 111 based on the stacking direction. The first cavity C1 may be formed using a blast method, is not limited thereto, and may be formed using a laser method or the like.

Figure 7:
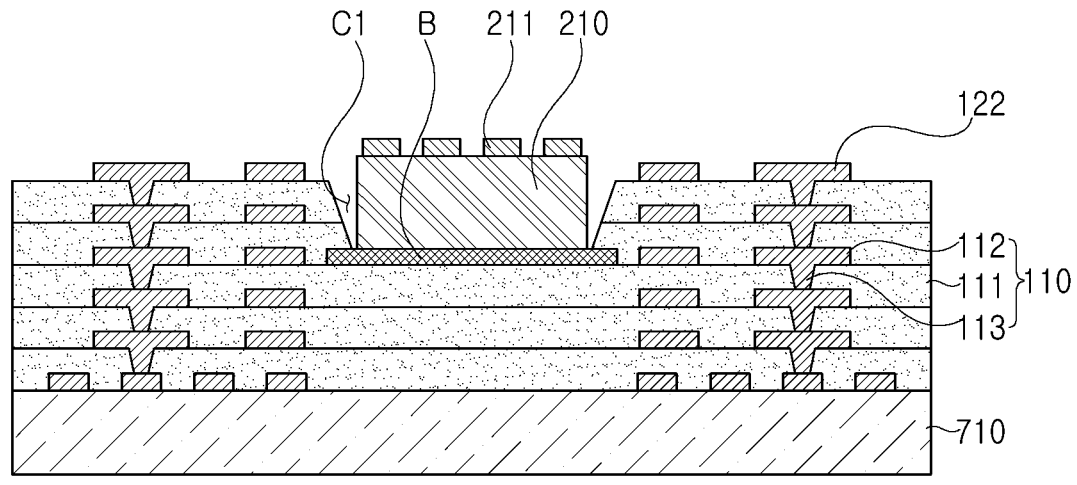

Referring to FIG. 7, the first passive device 210 may be disposed in the first cavity C1 formed on the barrier layer B. The first passive device 210 may be disposed in the first cavity C1 so that the first rear surface is attached to the barrier layer B. If necessary, the first passive device 210 may be attached using an adhesive such as a die attach film (DAF), in which case at least a portion of the adhesive may remain in the board unit 100 after the build-up process, and is not limited thereto.

Figure 8:
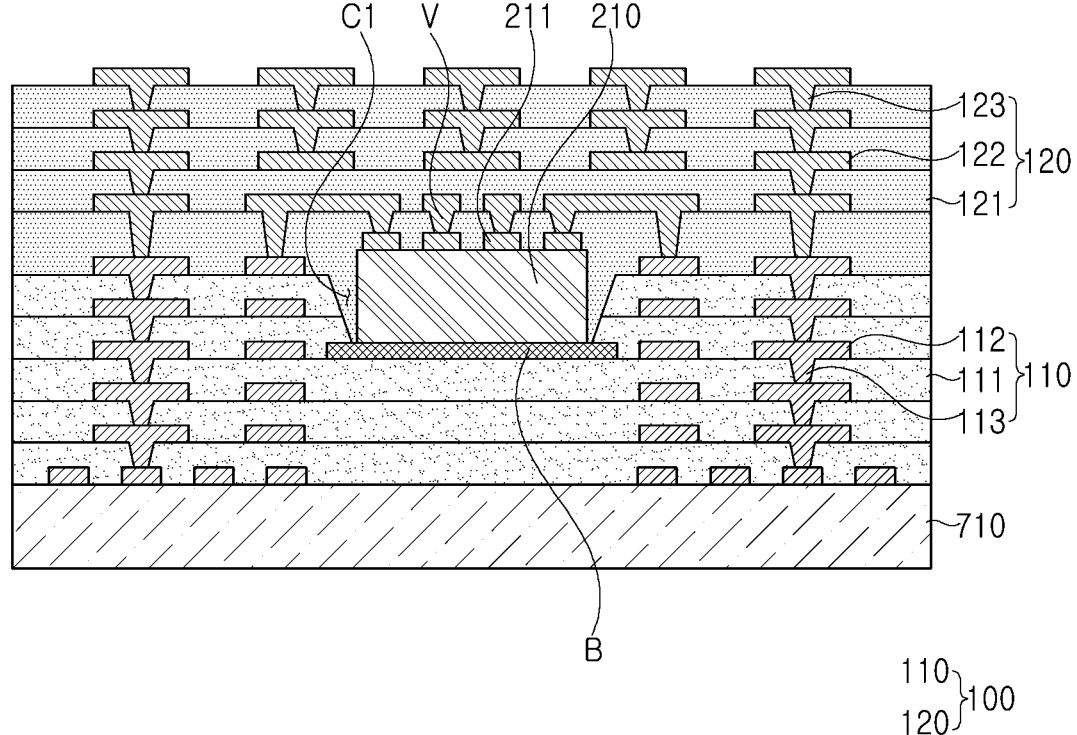

Referring to FIG. 8, the second board unit 120 may be formed on the first board unit 110 in the build-up process. Through this process, the board unit 100 may be formed. Here, the first passive device 210 may have at least a portion embedded in the second board unit 120, and may be electrically connected to the wiring layers 112 and 122 in the first and second board units 110 and 120 through the vias V. For example, the first passive device 210 may be disposed in the first cavity C1 by using embedding technology.

Figure 9:
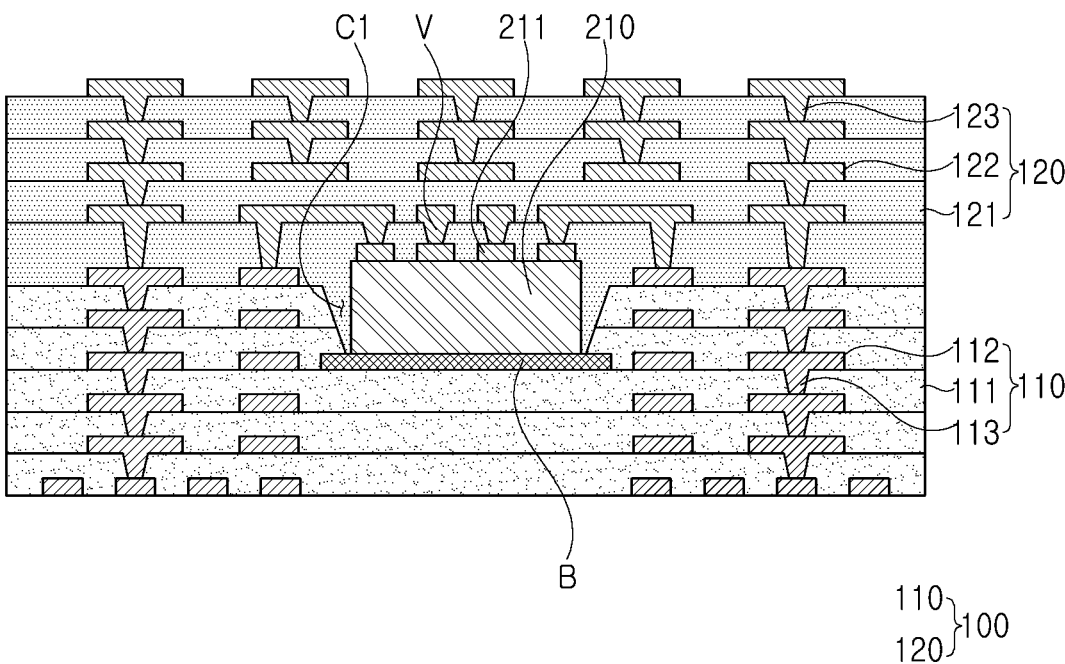

Referring to FIG. 9, the carrier board 710 may be removed. For example, the board unit 100 may be separated from the carrier board 710. For example, a plurality of metal layers of the carrier board 710 may be separated, and the metal layer of the carrier board 710 remaining on the board unit 100 after the separation may be removed using an etching method. Meanwhile, while using this etching method, the outermost first wiring layer 112 of the plurality of first wiring layers 112 may have a recess step with the outermost first insulating layer 111 of the plurality of first insulating layers 111.

Figure 10:
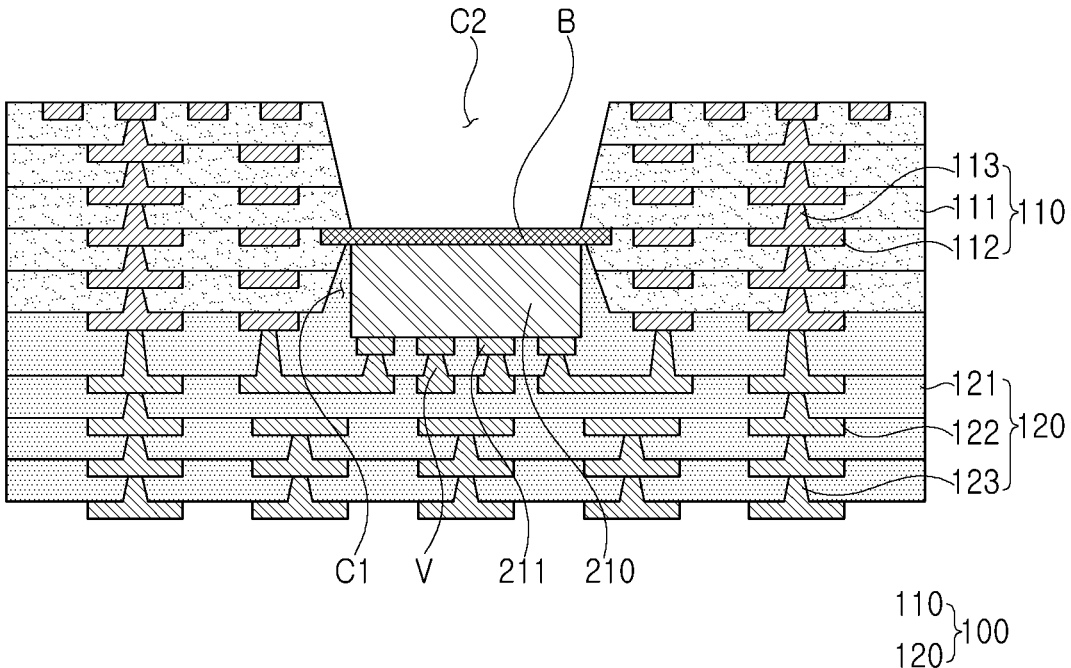

Referring to FIG. 10, the second cavity C2 may be formed in the first board unit 110 by using the barrier layer B as the stopper. The second cavity C2 may pass through at least another portion of the plurality of first insulating layers 111 other than some thereof passing through the first cavity C1 based on the stacking direction. The second cavity C2 may be formed using the blast method, is not limited thereto, and may be formed using the laser method or the like. Meanwhile, the second cavity C2 may be formed after inverting the board unit 100 upside down, contrary to the formation of the first cavity C1. For example, the first and second cavities C1 and C2 may be processed in opposite directions. Accordingly, the first and second cavities C1 and C2 may have the inclined surfaces in the opposite directions.

Figure 11:
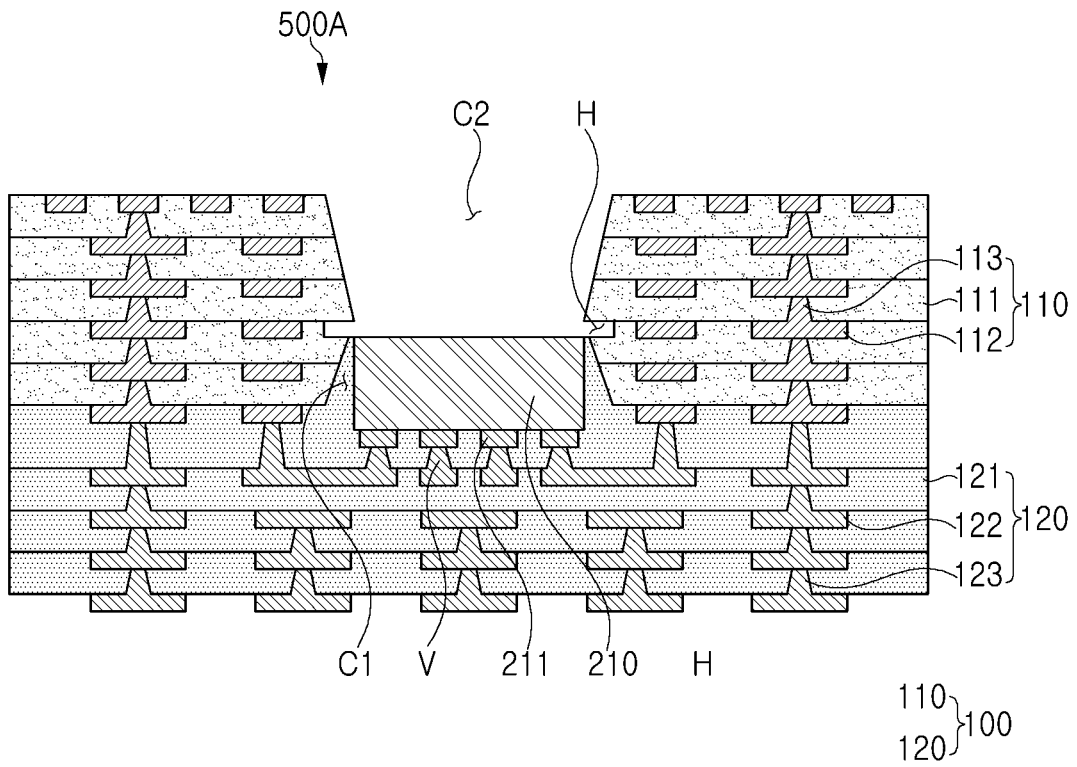

Referring to FIG. 11, the barrier layer B may be removed. When the barrier layer B includes a metal material, the metal material may be removed using the etching method. When the barrier layer B includes an insulating material, the insulating material may be removed using a peeling method. The peeling method may use a peeling solution. Through this process using a series of methods, the printed circuit board 500A according to another exemplary embodiment described above may be manufactured.

Figure 12:
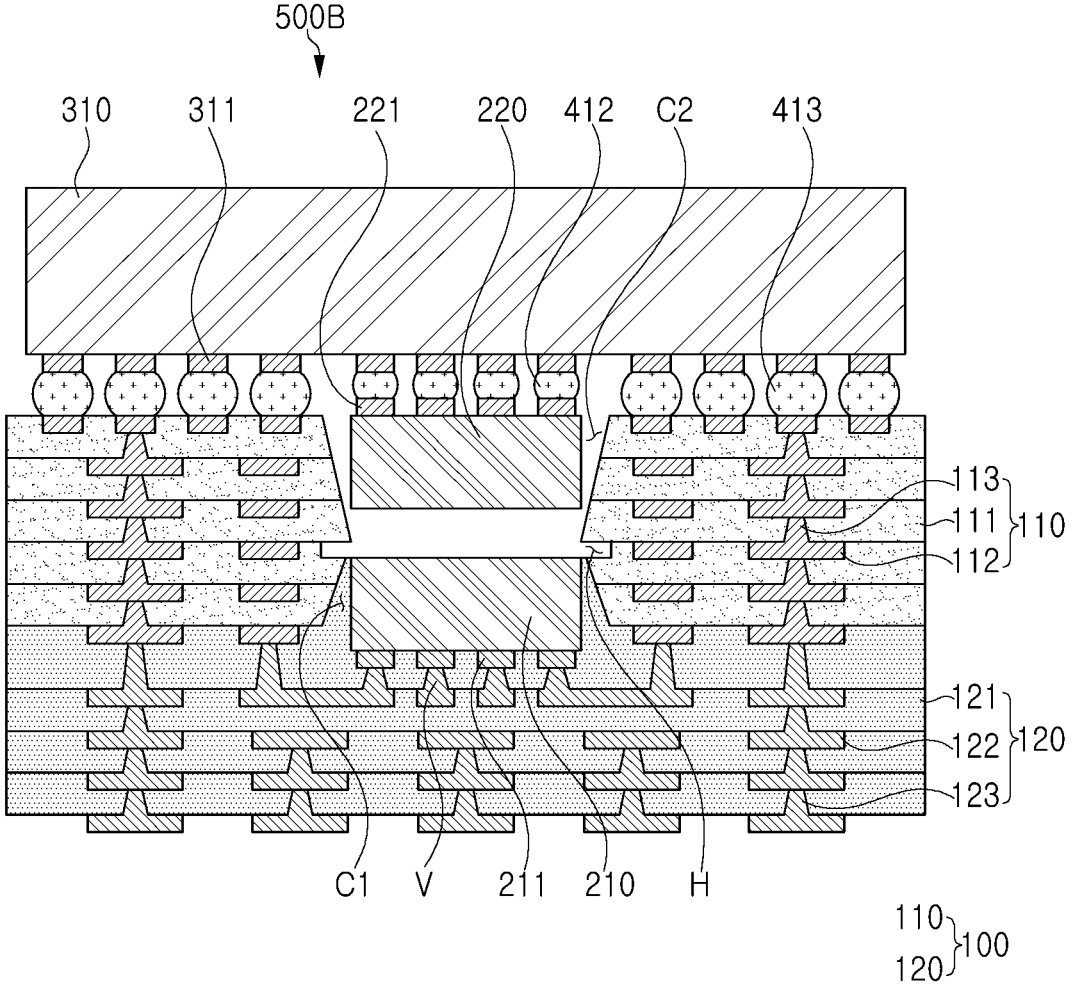

Referring to FIG. 12, the second passive device 220 may be attached to the active surface of the semiconductor chip 310 by using the second solder bump 412, and the semiconductor chip 310 may then be mounted on the board unit 100 by using the third solder bump 413 so that the second passive device 220 is disposed in the second cavity C2 of the board unit 100. Through this process using a series of methods, the printed circuit board 500B in the modified example described above may be manufactured.

Other contents are substantially the same as those described in the printed circuit board 500A according to an exemplary embodiment described above and the printed circuit board 500B in the modified example, and the description thus omits redundant descriptions thereof.

Figure 13:
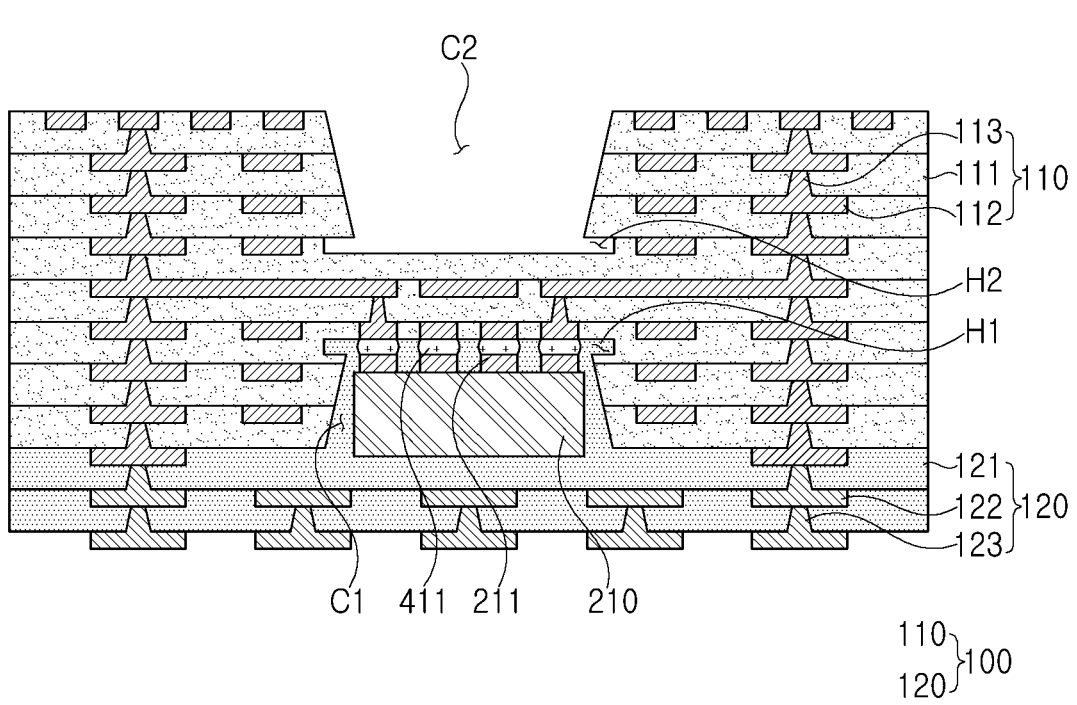
FIG. 13 is a cross-sectional view schematically showing a printed circuit board according to another exemplary embodiment.

FIG. 13 is a cross-sectional view schematically showing a printed circuit board according to another exemplary embodiment.

Figure 14:
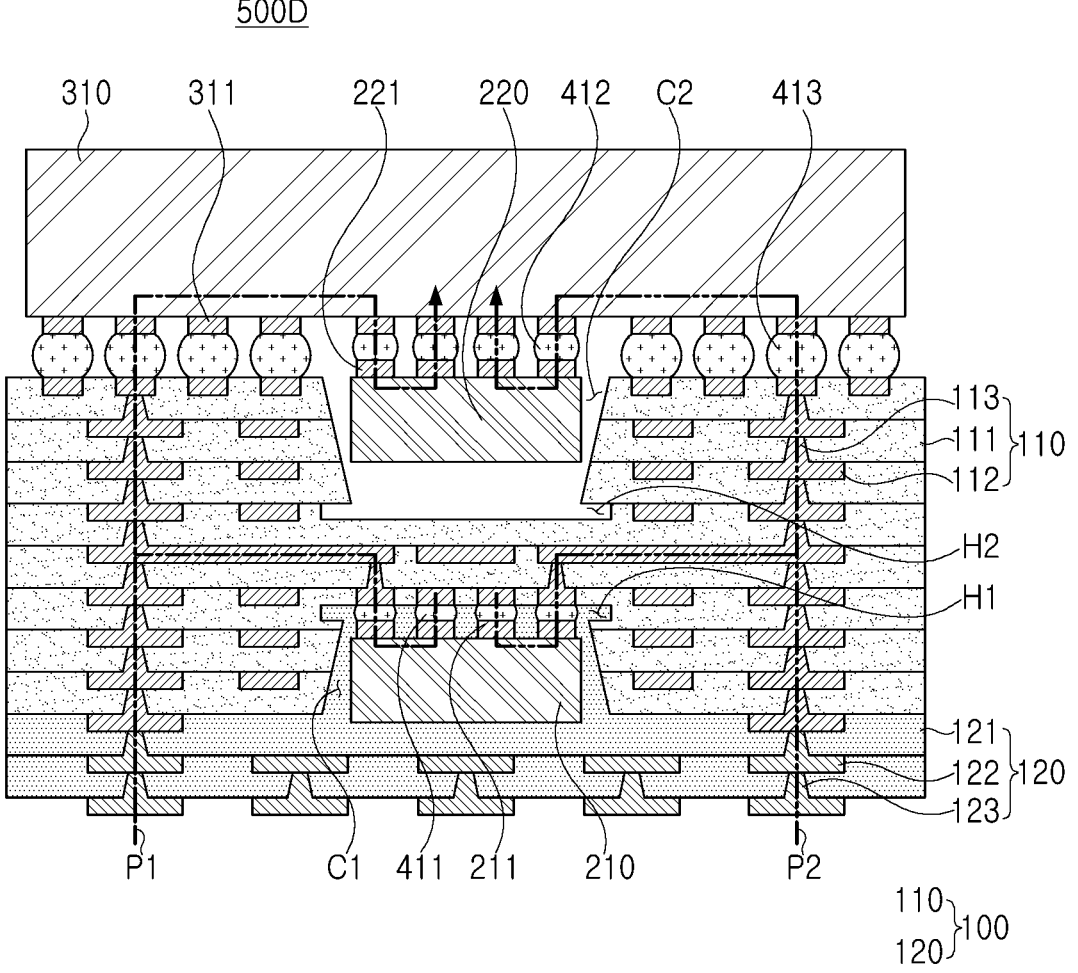
FIG. 14 is a cross-sectional view schematically showing a modified example of the printed circuit board of FIG. 13.

FIG. 14 is a cross-sectional view schematically showing a modified example of the printed circuit board of FIG. 13.

Referring to FIG. 13, a printed circuit board 500C according to another exemplary embodiment may include a board unit 100 having first and second cavities C1 and C2 formed at different levels based on a stacking direction, and a first passive device 210 disposed in the first cavity C1 and embedded in the board unit 100. In addition, a printed circuit board 500D in the modified example may further include a semiconductor chip 310 disposed on the board unit 100 and a second passive device 220 disposed in the second cavity C2 formed between the board unit 100 and the semiconductor chip 310.

Also in the printed circuit board 500C according to another exemplary embodiment and the printed circuit board 500D in the modified example, for example, the first cavity C1 may be formed during a build-up process of a coreless board unit 100, without a separate core layer, and the first passive device 210 may then be embedded, and the second cavity C2 may be additionally formed on the first cavity C1 based on the stacking direction. Here, as shown in the printed circuit board 500D in the modified example, the semiconductor chip 310 may be mounted on the board unit 100, and in this case, the second passive device 220 may be attached to an active surface of the semiconductor chip 310 and disposed in the second cavity C2. It is thus possible to minimize a distance between the semiconductor chip 310 and the first passive device 210 or the second passive device 220. In addition, the first and second passive devices 210 and 220 may be easily connected to each other in parallel. It is thus possible to further improve a power integrity (PI) characteristic.

Meanwhile, first and second groove portions H1 and H2 may respectively be formed in regions of the inner wall surfaces of the first and second cavities C1 and C2 that are adjacent to the bottom surfaces thereof, if necessary. The first and second groove portions H1 and H2 may be formed by removing a barrier layer as in the process to be described below. However, the first and second groove portions H1 and H2 are not limited thereto, and may be omitted depending on the disposition form or material of the barrier layer.

Meanwhile, the first passive device 210 may be disposed so that a first front surface faces the first board unit 110, and at least a portion of a first rear surface may be covered by at least one of second insulating layers 121 of a second board unit 120. For example, the first and second passive devices 210 and 220 may be disposed so that the first front surface and a second rear surface face each other. In addition, at least a portion of at least one of a plurality of first wiring layers 112 of the first board unit 110 may be exposed from the first cavity C1, and a first electrode pad 211 of the first passive device 210 may be connected to the exposed at least a portion of at least one of the plurality of first wiring layers 112 through a first solder bump 411. The exposed at least a portion of the first wiring layer 112 may be an embedded pattern, is not limited thereto, and may be a protruding pattern. In addition, at least one of a plurality of first insulating layers 111 of the first board unit 110 may be disposed between the first and second cavities C1 and C2 based on the stacking direction. Through this disposition, the first passive device 210 may be more reliable. Meanwhile, the first solder bump 411 may be formed of a low melting point metal such as tin (Sn)-aluminum (Al)-copper (Cu), may be a ball-type, and is not limited thereto.

Other contents are substantially the same as those described in the printed circuit board 500A according to an exemplary embodiment described above and the printed circuit board 500B in the modified example, and the description thus omits redundant descriptions thereof.

FIGS. 15 through 22 are cross-sectional views of the process, schematically showing an example of manufacturing the printed circuit board of FIG. 13 or the printed circuit board of FIG. 14.

Figure 15:
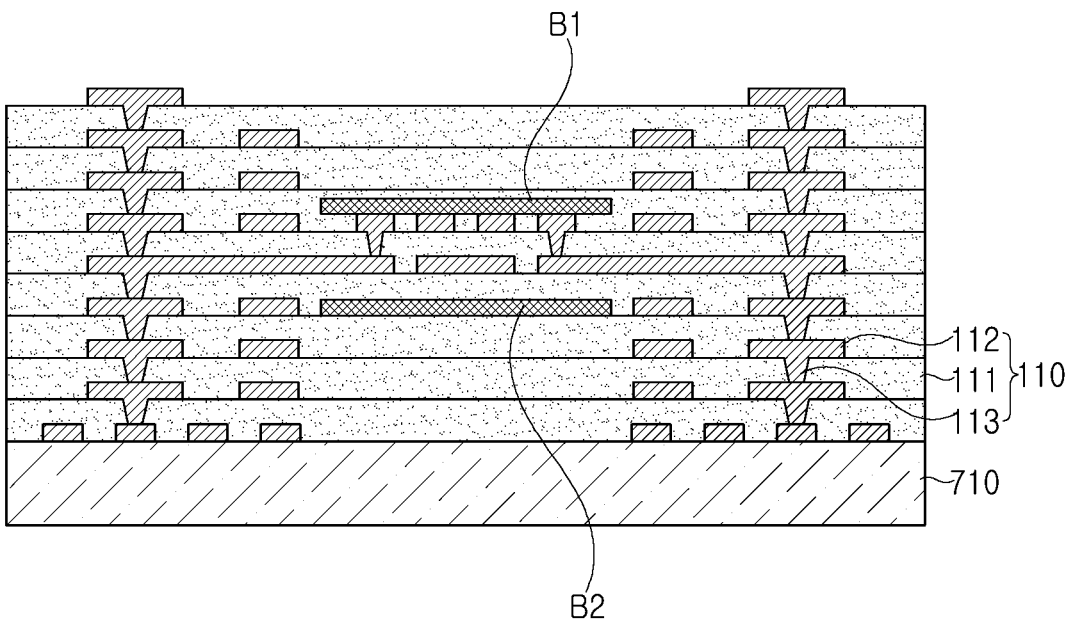
FIGS. 15 through 22 are cross-sectional views of a process, schematically showing an example of manufacturing the printed circuit board of FIG. 13 or the printed circuit board of FIG. 14.

Referring to FIG. 15, the first board unit 110 may be formed using a method of forming an embedded trace board (ETS) on a carrier board 710. Here, first and second barrier layers B1 and B2 may respectively be formed on or in one or another one of the plurality of first insulating layers 111. Each of the first and second barrier layers B1 and B2 may include a metal material, and may be formed together with the first wiring layer 112 of a corresponding layer by using a plating method when forming the first wiring layer 112 in the build-up process. Each of the first and second barrier layers B1 and B2 may include the same metal material as the first wiring layer 112, is not limited thereto, and may include another metal material having a different etching rate. Alternatively, each of the first and second barrier layers B1 and B2 may include an insulating material, and may be formed using a dry film or the like in the build-up process.

Figure 16:
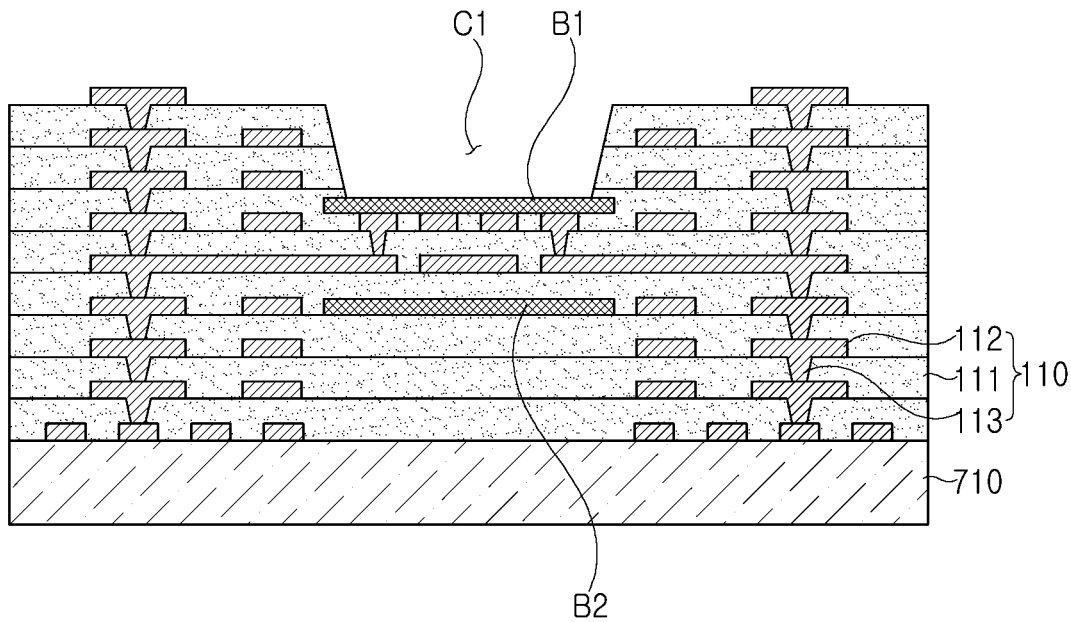

Referring to FIG. 16, the first cavity C1 may be formed in the first board unit 110 by using the first barrier layer B1 as a stopper. The first cavity C1 may pass through at least a portion of the plurality of first insulating layers 111 based on the stacking direction. The first cavity C1 may be formed using a blast method, and may be formed using a laser method or the like.

Figure 17:
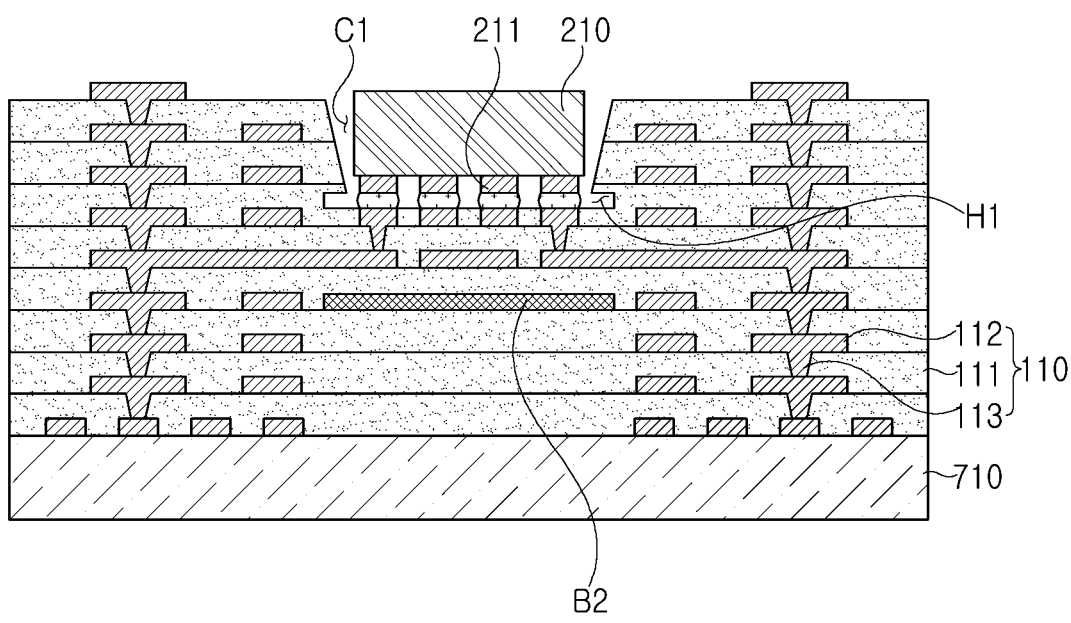

Referring to FIG. 17, the first barrier layer B1 may be removed. When the first barrier layer B1 includes a metal material, the metal material may be removed using an etching method. When the first barrier layer B1 includes an insulating material, the insulating material may be removed using a peeling method. The peeling method may use a peeling solution. Next, the first passive device 210 may be disposed in the first cavity C1. The first passive device 210 may be disposed in a face-down form so that the first front surface faces the first board unit 110. The first passive device 210 may be connected to at least a portion of at least one of the plurality of first wiring layers 112 of the first board unit 110, that is exposed from the first cavity C1 through the first solder bump 411. For example, the first passive device 210 may be disposed in the first cavity C1 of the first board unit 110 by using surface mounter technology (SMT).

Figure 18:
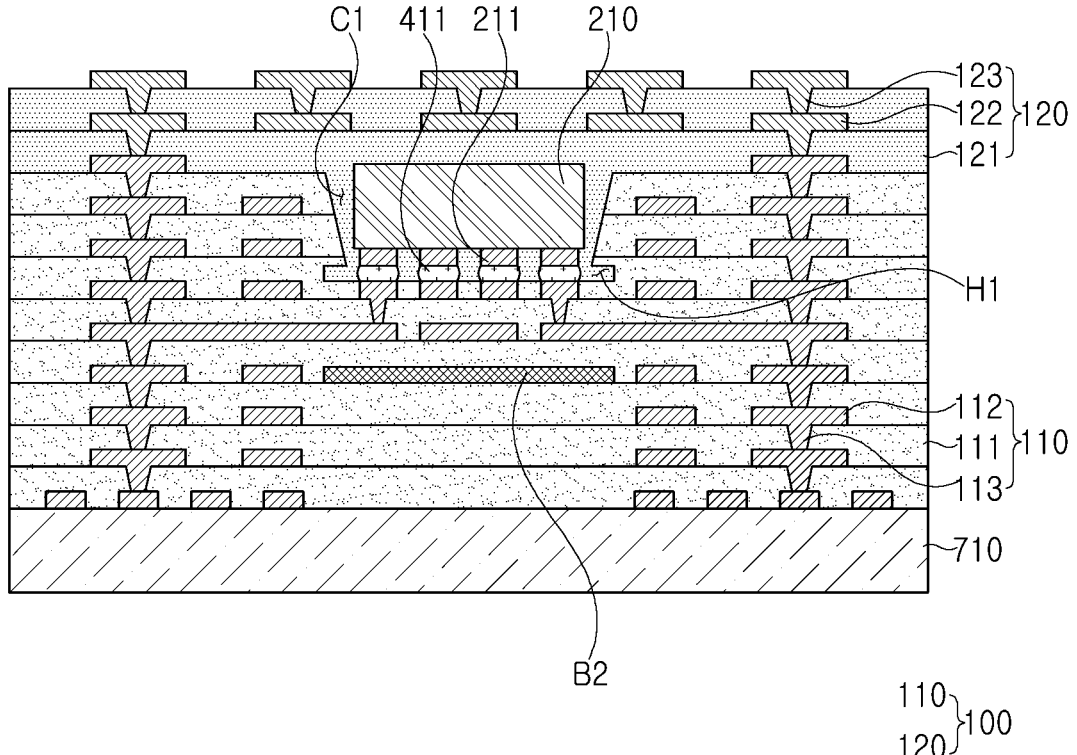

Referring to FIG. 18, the second board unit 120 may be formed on the first board unit 110 in the build-up process. Through this process, the board unit 100 may be formed. Here, at least a portion of the first passive device 210 may be embedded in the second board unit 120. For example, at least one of the one or more first insulating layers 121 of the second board unit 120 may bury at least a portion of the first passive device 210 and fill at least a portion of the first cavity C1.

Figure 19:
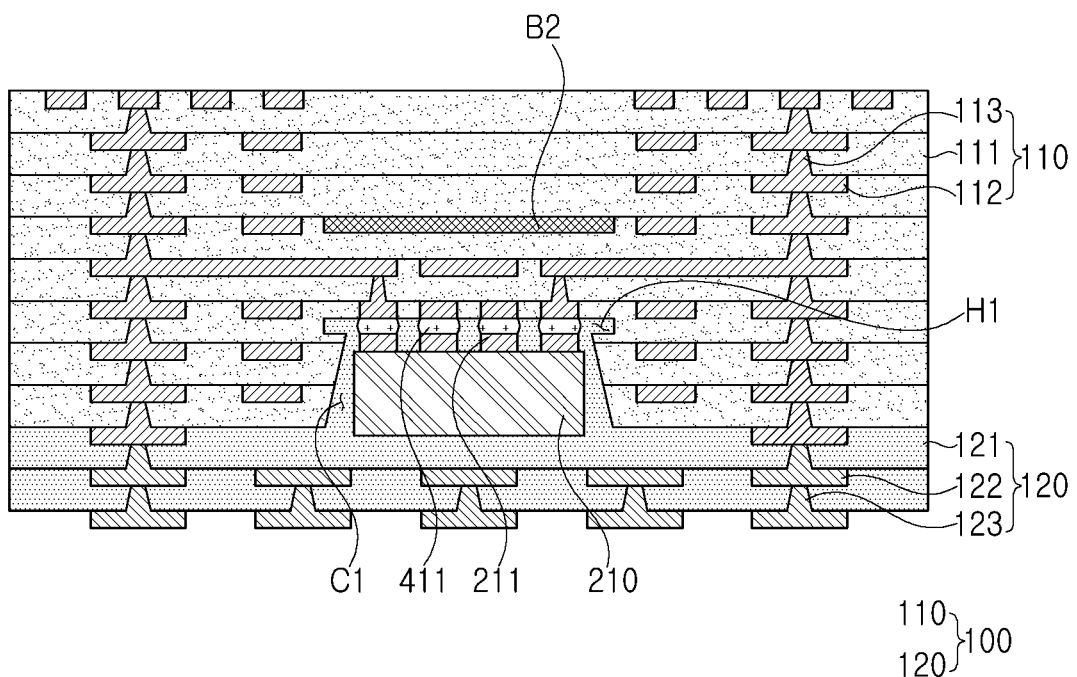

Referring to FIG. 19, the carrier board 710 may be removed. For example, the board unit 100 may be separated from the carrier board 710. For example, a plurality of metal layers of the carrier board 710 may be separated, and the metal layer of the carrier board 710 remaining on the board unit 100 after the separation may be removed using the etching method. Meanwhile, while using this etching method, the outermost first wiring layer 112 of the plurality of first wiring layers 112 may have a recess step with the outermost first insulating layer 111 of the plurality of first insulating layers 111.

Figure 20:
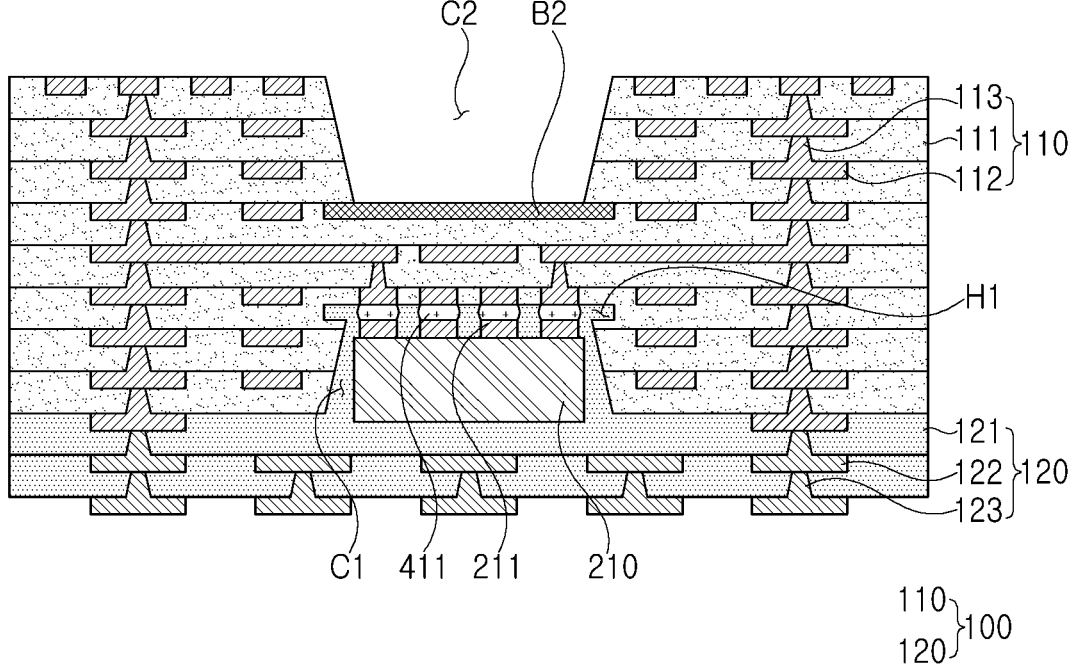

Referring to FIG. 20, the second cavity C2 may be formed in the first board unit 110 by using the second barrier layer B2 as the stopper. The second cavity C2 may pass through at least another portion of the plurality of first insulating layers 111 other than some thereof passing through the first cavity C1 based on the stacking direction. The second cavity C2 may be formed using the blast method, is not limited thereto, and may be formed using the laser method or the like. Meanwhile, the second cavity C2 may be formed after inverting the board unit 100 upside down, contrary to the formation of the first cavity C1. For example, the first and second cavities C1 and C2 may be processed in opposite directions. Accordingly, the first and second cavities C1 and C2 may have inclined surfaces in the opposite directions.

Figure 21:
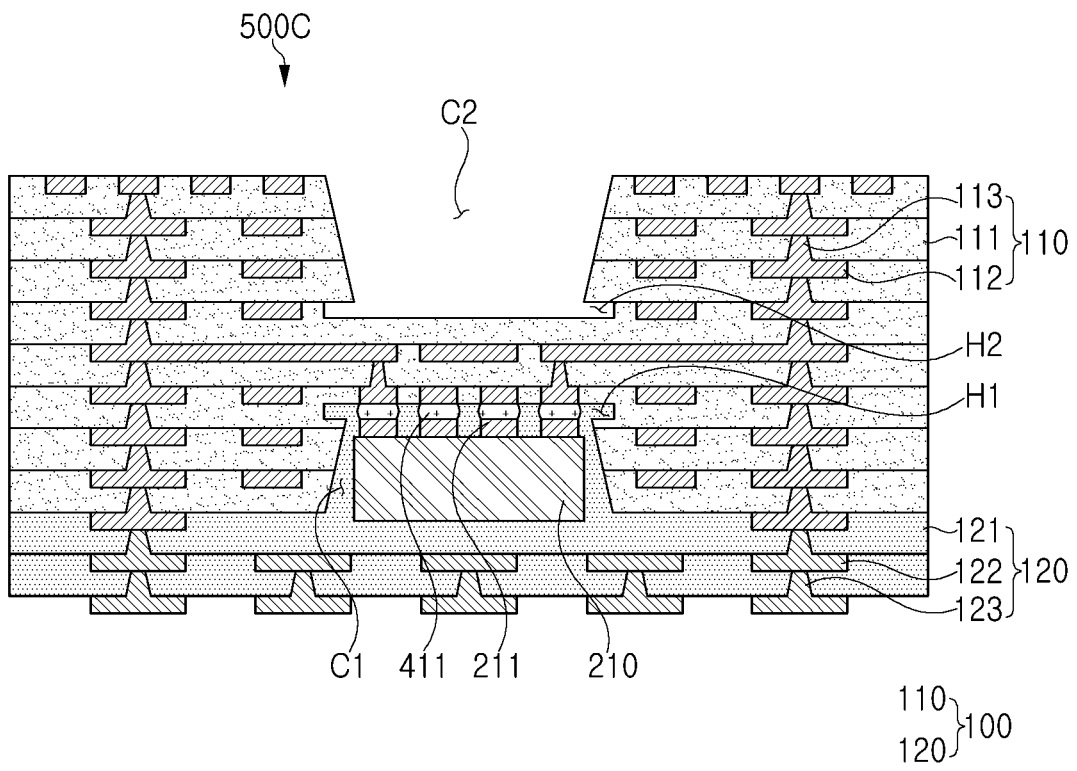

Referring to FIG. 21, the second barrier layer B2 may be removed. When the second barrier layer B2 includes a metal material, the metal material may be removed using the etching method. When the second barrier layer B2 includes an insulating material, the insulating material may be removed using a peeling method. The peeling method may use a peeling solution. Through this process using a series of methods, the printed circuit board 500C according to another exemplary embodiment described above may be manufactured.

Figure 22:
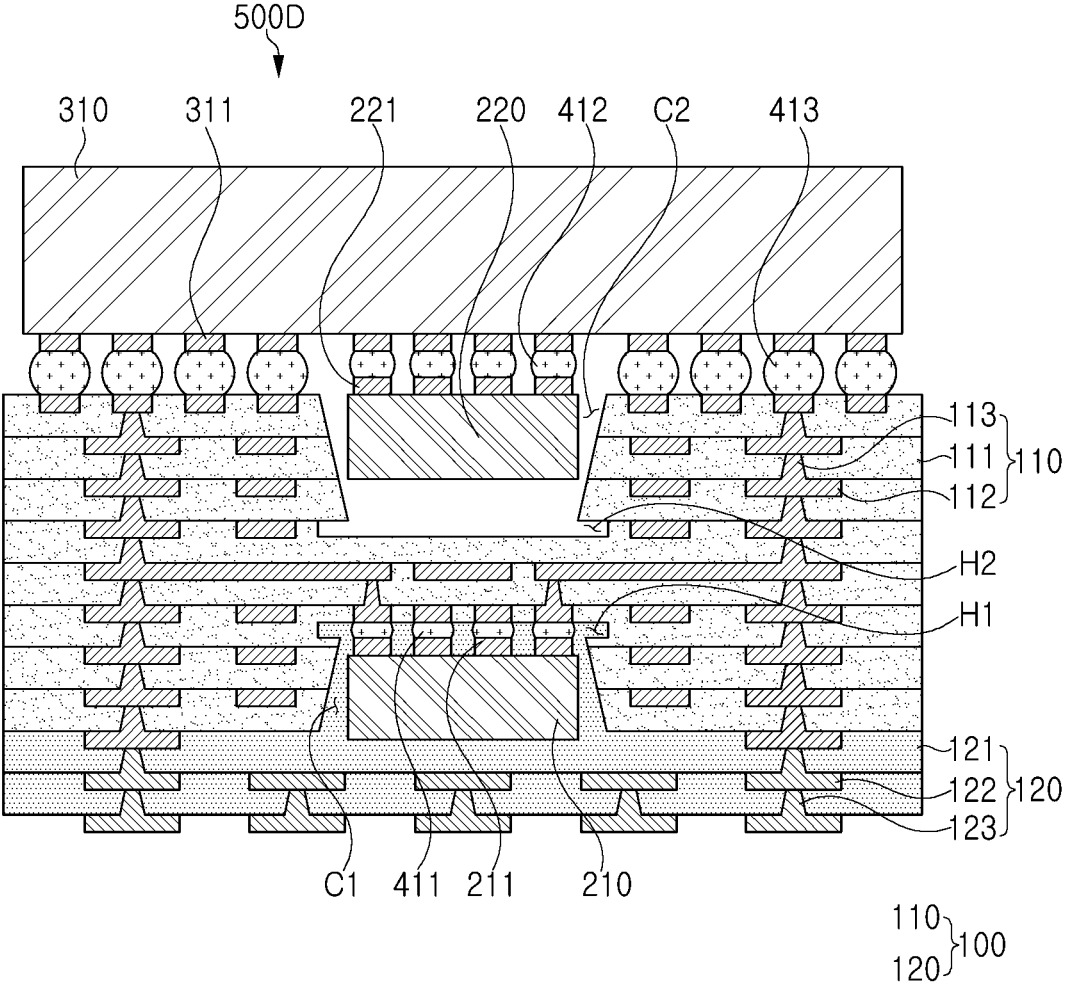

Referring to FIG. 22, the second passive device 220 may be attached to the active surface of the semiconductor chip 310 by using a second solder bump 412, and the semiconductor chip 310 may then be mounted on the board unit 100 by using a third solder bump 413 so that the second passive device 220 is disposed in the second cavity C2 of the board unit 100. Through this process using a series of methods, the printed circuit board 500D in the modified example described above may be manufactured.

Other contents are substantially the same as those described in the printed circuit board 500A according to an exemplary embodiment described above, the printed circuit board 500B in the modified example, the printed circuit board 500C according to another exemplary embodiment, and the printed circuit board 500D in the modified example, and the description thus omits redundant descriptions thereof.

As set forth above, the present disclosure may provide the printed circuit board which may minimize the distance between the semiconductor chip mounted on the board and the passive device.

The present disclosure may also provide the printed circuit board in which the plurality of passive devices may be easily connected to each other in parallel.

Connection between two components herein conceptually includes their indirect connection through a third component as well as their direct connection. In addition, it may be understood that when an element is referred to with terms such as "first" and "second," the element is not limited thereby. These terms are used only to distinguish the element from another element, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize each particular feature different from that of another exemplary embodiment. However, the exemplary embodiments provided herein may be implemented in combination with features of another exemplary embodiment. For example, a description of an element in a specific exemplary embodiment may be understood as its description in another exemplary embodiment even though the element is not described in another exemplary embodiment, unless an opposite or contradictory description is provided therein.

The terms used herein are used only to describe an exemplary embodiment rather than limiting the present disclosure. Here, a term of a singular number includes its plural number unless explicitly interpreted otherwise in context.

While the exemplary embodiments have been shown and described above, it will be apparent to those skilled in the art that modifications and variations could be made without departing from the scope of the present disclosure as defined by the appended claims.

What is claimed is:

1. A printed circuit board, comprising:
   a first board unit including a plurality of first insulating layers and a plurality of first wiring layers respectively disposed on or in the plurality of first insulating layers;
   a second board unit including one or more second insulating layers and one or more second wiring layers respectively disposed on or in the one or more second insulating layers; and
   a first passive device embedded in at least one of the first and second board units,
   wherein the second board unit is disposed on the first board unit, and
   the first board unit has a first cavity and a second cavity, the second cavity passing through at least a portion of the plurality of first insulating layers on the first passive device based on a stacking direction of the plurality of first wiring layers, and the first cavity passing through at least another portion of the plurality of first insulating layers based on the stacking direction.

2. The printed circuit board of claim 1, wherein
   the first passive device is disposed in the first cavity, and
   at least one of the one or more second insulating layers covers at least a portion of the first passive device and is disposed in at least a portion of the first cavity.

3. The printed circuit board of claim 2, wherein the first and second cavities at least partially overlap each other based on the stacking direction.

4. The printed circuit board of claim 2, wherein the first passive device has a first front surface on which a first electrode pad is disposed and a first rear surface opposite to the first front surface.

5. The printed circuit board of claim 4, wherein the first passive device includes an integrated passive device (IPD).

6. The printed circuit board of claim 4, wherein the first front surface faces the second board unit, and at least a portion of the first rear surface is exposed from the second cavity.

7. The printed circuit board of claim 6, wherein the first electrode pad is connected to at least one of the one or more second wiring layers through a via passing through at least one of the one or more second insulating layers.

8. The printed circuit board of claim 6, wherein at least a portion of the plurality of first insulating layers and the one or more second insulating layers are not disposed between the first and second cavities based on the stacking direction.

9. The printed circuit board of claim 6, wherein a groove portion is disposed in a region of an inner wall surface of the second cavity that is adjacent to a bottom surface thereof.

10. The printed circuit board of claim 4, wherein the first front surface faces the first board unit, and at least a portion of the first rear surface is covered by at least one of the one or more second insulating layers.

11. The printed circuit board of claim 10, wherein at least a portion of at least one of the plurality of first wiring layers is exposed from the first cavity, and
    the first electrode pad is connected to the exposed at least a portion of at least one of the plurality of first wiring layers through a first solder bump.

12. The printed circuit board of claim 10, wherein at least one of the plurality of first insulating layers is disposed between the first and second cavities based on the stacking direction.

13. The printed circuit board of claim 10, wherein first and second groove portions are respectively disposed in regions of inner wall surfaces of the first and second cavities that are adjacent to bottom surfaces thereof.

14. The printed circuit board of claim 1, further comprising:
    a semiconductor chip having an active surface on which a plurality of connection pads are disposed and a non-active surface opposite to the active surface, and disposed on a surface of the first board unit that is opposite to another surface of the first board unit on which the second board unit is disposed such that the active surface faces the first board unit; and
    a second passive device having a second front surface on which second electrode pad are disposed and a second rear surface opposite to the second front surface, and disposed on the active surface of the semiconductor chip such that the second front surface faces the semiconductor chip,
    wherein the second passive device is disposed in the second cavity, and the plurality of connection pads are respectively connected to the second electrode pads and an outermost first wiring layer of the plurality of first wiring layers through second and third solder bumps.

15. The printed circuit board of claim 14, wherein the semiconductor chip includes a system on chip (SoC), and each of the first and second passive devices includes an integrated passive device (IPD).

16. The printed circuit board of claim 14, wherein the first and second passive devices are electrically connected to each other through a path passing through the plurality of first wiring layers, the one or more second wiring layers, and the semiconductor chip.

17. A printed circuit board, comprising:

a board unit including a plurality of insulating layers and a plurality of wiring layers, and having a first cavity passing through at least a portion of the plurality of insulating layers based on a stacking direction of the plurality of wiring layers and a second cavity passing through at least another portion of the plurality of insulating layers based on the stacking direction; and a first passive device disposed in the first cavity and having at least a portion embedded in the plurality of insulating layers, wherein inner wall surfaces of the first and second cavities are tapered in opposite directions.

18. The printed circuit board of claim 17, further comprising:

a semiconductor chip disposed on the board unit; and a second passive device disposed between the board unit and the semiconductor chip, wherein the second passive device is disposed in the second cavity, and the second passive device is physically separated from the board unit.

19. A printed circuit board, the board comprising:

a plurality of insulating layers and a plurality of wiring layers stacked in a stacking direction;

a first device at least partially embedded in the plurality of insulating layers; and a cavity extending from an outermost one of the plurality of insulating layers to overlap at least a portion of the first device in the stacking direction, wherein the first device is spaced apart from a region of the cavity between side surfaces of the outermost one of the plurality of insulating layers.

20. The printed circuit board of claim 19, wherein at least one of the insulating layers and at least one of the plurality of wiring layers overlap the first device in the stacking direction, such that the first device is connected to the at least one of the plurality of wiring layers.

21. The printed circuit board of claim 20, wherein the first device is disposed between the cavity and the at least one of the plurality of wiring layers.

22. The printed circuit board of claim 20, wherein the at least one of the plurality of wiring layers is disposed between the first device and the cavity.

23. The printed circuit board of claim 19, wherein one or more groove portions are disposed in one inner wall surface of the cavity.

24. The printed circuit board of claim 23, wherein the number of the one or more groove portions in the one inner wall surface of the cavity is two, and the two groove portions are respectively disposed in two of the plurality of insulating layers.

25. The printed circuit board of claim 19, further comprising:

a semiconductor chip disposed on the outermost one of the plurality of insulating layers, and having an active surface, on which a plurality of connection pads are disposed, facing the outermost one of the plurality of insulating layers; and a passive device attached to the semiconductor chip and at least partially disposed in the cavity.

26. The printed circuit board of claim 25, wherein the first and second devices are electrically connected to each other through at least the semiconductor chip and one or more of the plurality of wiring layers.

* * * * *